(12) United States Patent
Hu

(10) Patent No.: US 11,882,682 B2
(45) Date of Patent: Jan. 23, 2024

(54) METHOD FOR MANUFACTURING SEMICONDUCTOR STRUCTURE, AND SEMICONDUCTOR STRUCTURE

(71) Applicant: CHANGXIN MEMORY TECHNOLOGIES, INC., Hefei (CN)

(72) Inventor: Jiancheng Hu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 151 days.

(21) Appl. No.: 17/406,031

(22) Filed: Aug. 18, 2021

(65) Prior Publication Data
US 2022/0037333 A1 Feb. 3, 2022

Related U.S. Application Data

(63) Continuation of application No. PCT/CN2021/101636, filed on Jun. 22, 2021.

(30) Foreign Application Priority Data

Jul. 31, 2020 (CN) .......................... 202010758023.4

(51) Int. Cl.
H10B 12/00 (2023.01)
H01L 49/02 (2006.01)

(52) U.S. Cl.
CPC ......... *H10B 12/0335* (2023.02); *H01L 28/84* (2013.01); *H01L 28/90* (2013.01); *H10B 12/30* (2023.02)

(58) Field of Classification Search
None
See application file for complete search history.

(56) References Cited

U.S. PATENT DOCUMENTS

2001/0046737 A1   11/2001  Ahn et al.
2002/0113237 A1*  8/2002   Kitamura ........... H10B 12/0335
                                              257/E21.018
2010/0187588 A1*  7/2010   Kim .................... H10B 12/318
                                              257/306

FOREIGN PATENT DOCUMENTS

CN   100338759 C   9/2007
CN   101825823 A   9/2010
CN   102655176 A   9/2012
CN   107946302 A   4/2018

(Continued)

*Primary Examiner* — Erik T. K. Peterson
*Assistant Examiner* — Christopher A. Schodde
(74) *Attorney, Agent, or Firm* — Kilpatrick Townsend & Stockton LLP

(57) ABSTRACT

Embodiments relate to a method for manufacturing a semiconductor structure, and the semiconductor structure. The method includes: providing a substrate in which a plurality of contact pads arranged in an array are provided, wherein the contact pad protrudes from the upper surface of the substrate; forming a first barrier layer on the substrate and the surface of the contact pad; forming a first conductive layer on the surface of the first barrier layer; etching the upper surface of the first conductive layer to form a first recessed structure and a second recessed structure, wherein the first recessed structure extends downward to the substrate, the projection of the first recessed structure on the substrate surrounds the contact pad, and the second recessed structure is formed in the first conductive layer and arranged above each of the corresponding contact pads.

14 Claims, 5 Drawing Sheets

(56) References Cited

FOREIGN PATENT DOCUMENTS

| | | | |
|---|---|---|---|
| CN | 108962824 | A | 12/2018 |
| CN | 110459533 | A | 11/2019 |
| CN | 111223843 | A | 6/2020 |

\* cited by examiner

METHOD FOR MANUFACTURING SEMICONDUCTOR STRUCTURE, AND SEMICONDUCTOR STRUCTURE

CROSS-REFERENCES TO RELATED APPLICATIONS

The present disclosure is a continuation of PCT/CN2021/101636, filed on Jun. 22, 2021, which claims priority to the Chinese patent application 202010758023.4 titled "METHOD FOR MANUFACTURING SEMICONDUCTOR STRUCTURE, AND SEMICONDUCTOR STRUCTURE" and filed on Jul. 31, 2020, the entire contents of which are incorporated herein by reference.

TECHNICAL FIELD

The present disclosure relates to the field of semiconductor technology, and more particularly, to a method for manufacturing a semiconductor structure, and the semiconductor structure.

BACKGROUND

DRAM (Dynamic Random Access Memory) is a semiconductor storage device commonly used in a computer and consists of many duplicate memory units. In DRAM, a capacitance device is connected to a transistor to store the contents of a memory.

A capacitance device is a passive electronic element that stores energy in the form of electrostatic field. A common capacitance devices include a lower electrode layer, a capacitance dielectric layer, and an upper electrode layer. Compared with a single-sided capacitor, a double-sided capacitor may increase the capacitance value per unit area.

In related arts, when a double-sided capacitor is produced, holes are etched in a dielectric layer structure and fall on a contact pad. The holes are used as a matrix to deposit a thin film to produce the lower electrode. After removing the remaining dielectric layer material, the thin film is deposited sequentially at the two sides of the lower electrode to produce a dielectric medium. The lower electrode and the upper electrode form a double-sided capacitance structure.

During the manufacturing process, the holes are used as a matrix to deposit the thin film to produce the lower electrode, which causes the capacitance structure to be unstable.

SUMMARY

An objective of an embodiment of the present disclosure is to provide a method for manufacturing a semiconductor structure, and a semiconductor structure, so as to solve the problem of structural instability of the semiconductor structure during the manufacturing process at least to a certain extent.

Other features and advantages of the present disclosure become apparent through the following detailed description, or are partly learned through the practice of the present disclosure.

According to a first aspect of the embodiments of the present disclosure, there is provided a method for manufacturing a semiconductor structure. The method includes: providing a substrate in which a plurality of contact pads arranged in an array are provided, wherein the contact pad protrudes from the upper surface of the substrate; forming a first barrier layer on the substrate and the surface of the contact pad; forming a first conductive layer on the surface of the first barrier layer; etching the upper surface of the first conductive layer to form a first recessed structure and a second recessed structure, wherein the first recessed structure extends downward to the substrate, the projection of the first recessed structure on the substrate surrounds the contact pad, and the second recessed structure is formed in the first conductive layer and arranged above each of the corresponding contact pads; and forming a first dielectric layer, a second barrier layer, and a second conductive layer sequentially on the surface of the first conductive layer floor.

According to a second aspect of the embodiment of the present disclosure, there is provided a semiconductor structure. The semiconductor structure includes: a substrate in which a plurality of contact pads arranged in an array are provided, wherein the contact pad protrudes from the upper surface of the substrate; a first barrier layer, arranged on the substrate and the surface of the contact pad; a first conductive layer, arranged on the surface of the first barrier layer; a first recessed structure and a second recessed structure, wherein the first recessed structure extends downward from the upper surface of the first conductive layer to the substrate, the projection of the first recess structure on the substrate surrounds the contact pad, and the second recessed structure is formed in the first conductive layer and arranged above the corresponding contact pad; and a first dielectric layer, a second barrier layer, and a second conductive layer sequentially arranged above the first conductive layer.

The technical solutions of embodiments of the present disclosure may bring about the following beneficial effects:

In the technical solutions provided by some embodiments of the present disclosure, the first conductive layer is etched to form the recessed structure so that the lower electrode corresponding to the contact pad is formed on the first conductive layer, which is beneficial to maintaining the stability of the semiconductor during the manufacturing process.

It should be understood that the above general description and the following detailed description are only exemplary and explanatory, and cannot limit the present disclosure.

BRIEF DESCRIPTION OF THE DIAGRAMS

The accompanying drawings herein are incorporated into the specification and constitute a part of the specification, show embodiments in accordance with the present disclosure, and are used for explaining the principle of the disclosure together with the specification. Obviously, the accompanying drawings in the following description are only some embodiments of the present disclosure. Those ordinary persons skilled in the art can obtain other accompanying drawings based on these drawings without inventive labor. In the drawings:

FIG. 1 schematically shows a cross-sectional view of a capacitance device in the related arts;

FIG. 2 schematically shows a schematic flowchart of a method for manufacturing a semiconductor structure according to embodiments of the present disclosure;

DESCRIPTION OF EMBODIMENTS

The following describes example embodiments of the present disclosure in a more detailed manner with reference to accompanying drawings. However, the exemplary embodiments can be implemented in various forms, and should not be construed as being limited to examples set forth herein. On the contrary, these embodiments are provided so that the present disclosure is more comprehensive and complete, and the concept of the exemplary embodiments is comprehensive conveyed to those ordinary persons skilled in the art. The same reference signs in the accompanying drawings indicate the same or similar structures, and thus the detailed descriptions thereof are omitted.

Although relative terms such as "upper" and "lower" are used in this specification to describe the relationship between one assembly of one reference sign relative to another assembly. However, these terms are used in this specification only for convenience, for example, a direction of the example shown in the accompanying drawings. It may be understood that if the module of the reference sign is turned over and turned upside down, the "upper" assembly described becomes the "lower" assembly. Other relative terms, such as "high", "low", "top", "bottom", "left" and "right" have similar meanings. When a structure is "on" other structure, it may mean that the structure is integrally formed on other structure, or that the structure is "directly" arranged on other structure, or that the structure is "indirectly" arranged on other structure through another structure.

The terms "a", "an", and "the" are used for indicating the presence of one or more elements/components/etc. The terms "including" and "having" are used to indicate open-ended inclusion and indicate that in addition to the listed elements/components/etc., there can be additional elements/components/etc.

Figure 1:
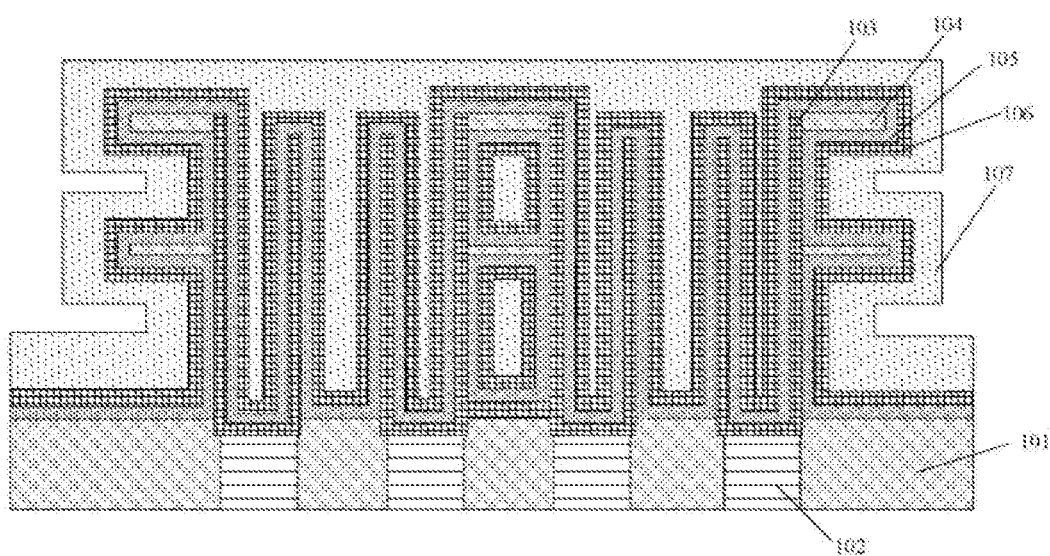

In the related arts, when manufacturing a capacitance device as shown in FIG. 1, a contact pad 102 arranged in an array is formed in a substrate 101. A dielectric layer made of silicon oxide is etched to form holes. The holes are used as a matrix to deposit a thin film to produce a lower electrode 103. After removing the remaining material of the dielectric layer, thin films are sequentially deposited on the both sides of the lower electrode 103 to produce a dielectric layer 105. The lower electrode 103, an upper electrode 106, and a polysilicon 107 form a double-sided capacitance structure. A support layer 104 and a support layer 108 that are made of silicon nitride are configured to increase the stability of a semiconductor structure.

In the manufacturing process, the holes are used as the matrix to deposit the thin film to produce the lower electrode, which causes the capacitance structure to be unstable.

In order to solve the above problems, embodiments of the present disclosure provide a method for manufacturing a semiconductor structure, and the semiconductor structure to enhance the stability of the semiconductor structure during the manufacturing process.

Figure 2:
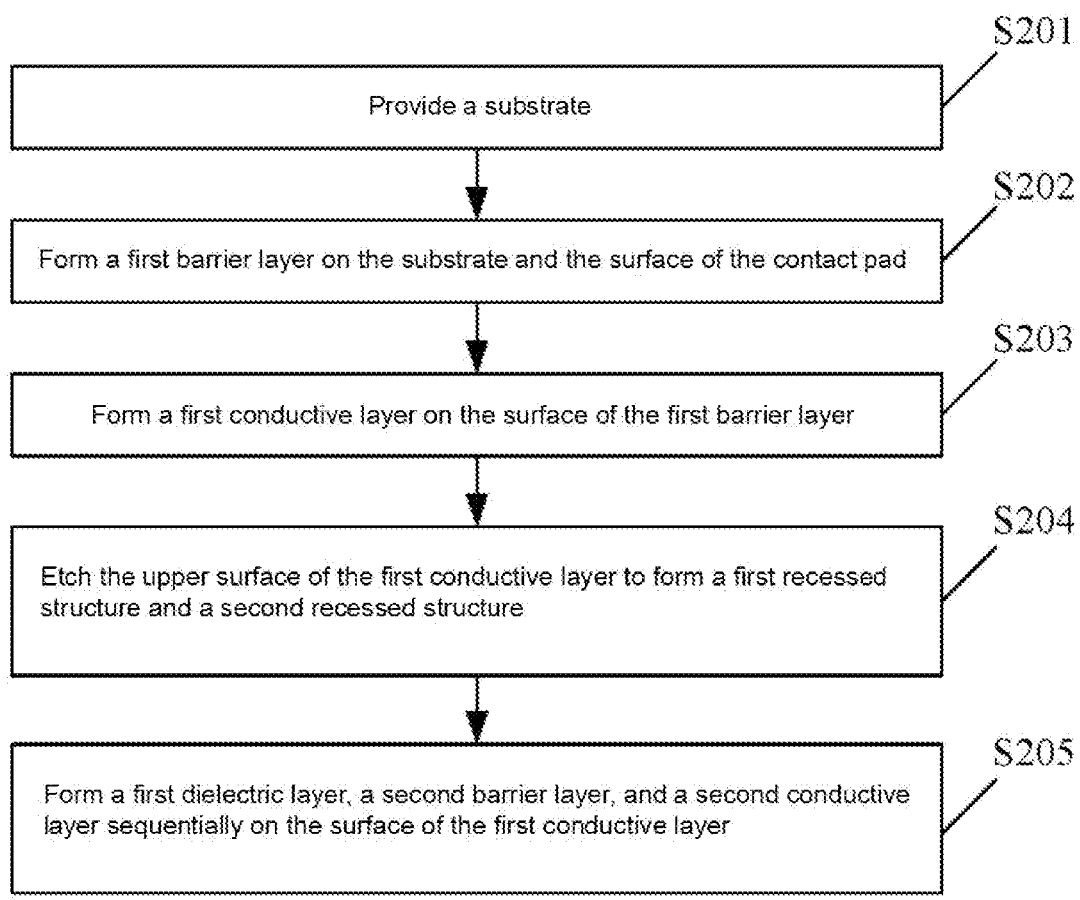

As shown in FIG. 2, a method for manufacturing a semiconductor structure according to embodiments of the present disclosure includes the following steps:

Step S201, providing a substrate, wherein a plurality of contact pads arranged in an array are provided in the substrate, and the contact pad protrudes from the upper surface of the substrate.

Step S202, forming a first barrier layer on the surface of the substrate and the contact pad.

Step S203, forming a first conductive layer on the surface of the first barrier layer.

Step S204, etching the upper surface of the first conductive layer to form a first recessed structure and a second recessed structure, wherein the first recessed structure extends downwards to the substrate, the projection of the first recessed structure on the substrate surrounds the contact pad, and the second recessed structure is formed in the first conductive layer and arranged above the corresponding contact pad.

In step S205, forming a first dielectric layer, a second barrier layer, and a second conductive layer sequentially on the surface of the first conductive layer.

In the technical solution of the embodiment of the present disclosure, the first conductive layer is etched to form the recessed structure and further to form a lower electrode of a semiconductor structure such as a capacitance device and the like. Compared with the related arts that the dielectric layer is etched to form holes, the holes are used as a matrix to deposit a thin film to produce the lower electrode, which improves the stability of the semiconductor structure.

Figure 3:
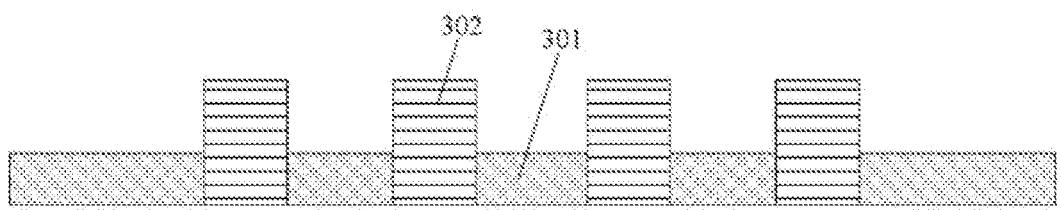
FIGS. 3 to 5 are schematic cross-sectional views of steps S201 to S203.

In the technical solution of the embodiment of the present disclosure, as shown in FIG. 3, the contact pads 302 arranged in an array are provided in the substrate 301. The substrate 301 may be made of silicon nitride, and the contact pad 302 may be made of polysilicon, but is not limited thereto. The contact pad 302 may be arranged in a hexagonal array, which corresponds to the arrangement of the semiconductor structure to be subsequently fabricated.

Figure 4:
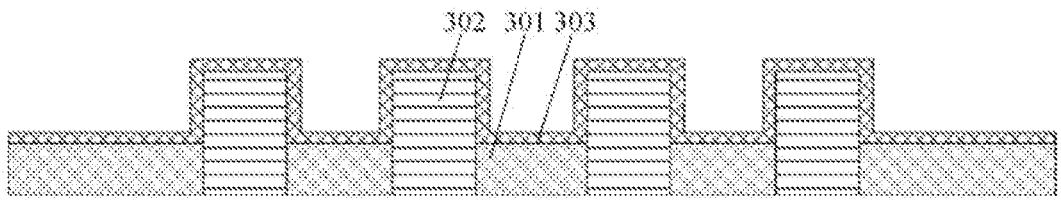

In step S202, as shown in FIG. 4, a titanium nitride material is deposited on the surface of the substrate 301 and the surface of the part of the contact pad 302 protruding from the top surface of the substrate to form the first barrier layer 303.

The deposition process in the embodiments of the present disclosure may use an atomic layer deposition process or a chemical vapor deposition process, and is not limited thereto.

Figure 5:
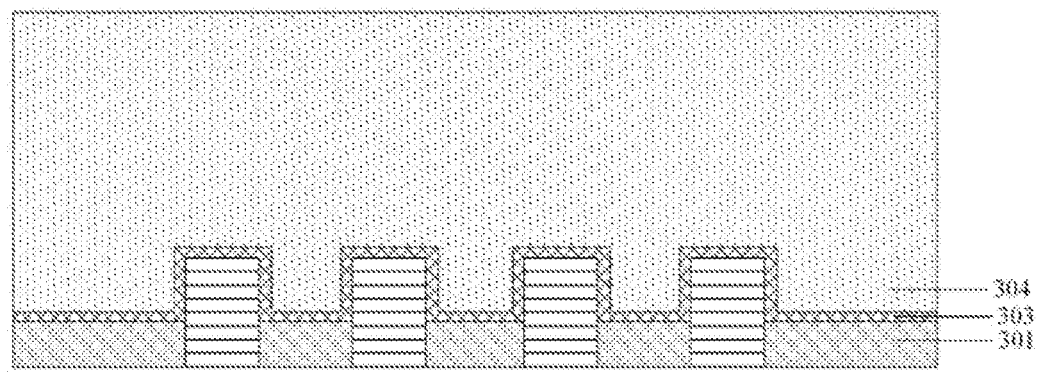

In step S203, as shown in FIG. 5, a polysilicon material is deposited on the surface of the first barrier layer 303 to form the first conductive layer 304.

Figure 6:
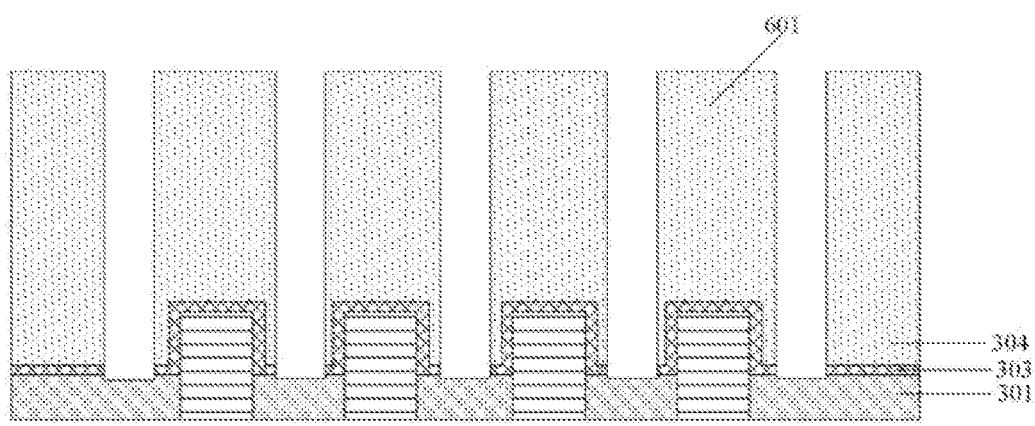
FIG. 6 is a schematic cross-sectional view after forming a first recessed structure in step S204.
Figure 7:
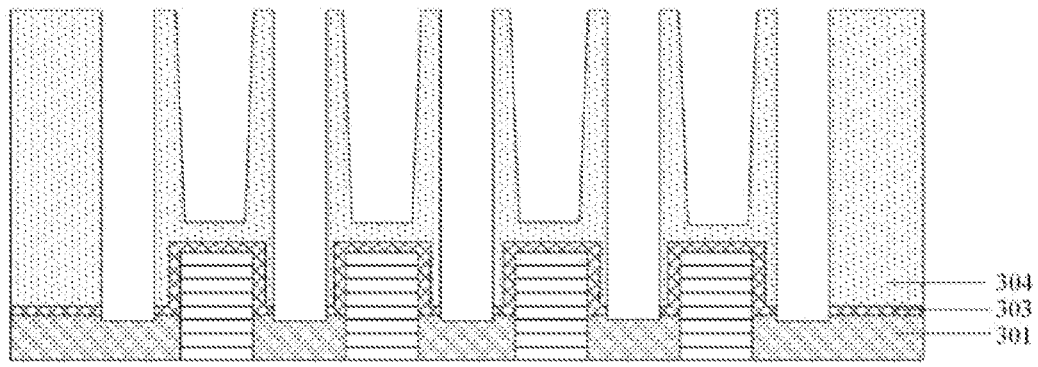
FIG. 7 is a schematic cross-sectional view after forming second recessed structure in step S204.

In step S204, as shown in FIG. 6, the first conductive layer and the first barrier layer are etched to the substrate, so as to form the same number of conductive columns 601 as the contact pads. As shown in FIG. 7, after forming the conductive column, the upper surface of each conductive column is etched to form a cylindrical structure with an upper opening.

As shown in FIG. 7, the cross section of the conductive column is H-shaped. In the process of forming the first recessed structure by etching, the upper surface of the first conductive layer is etched downwards to remove part of the material of the first conductive layer and part of the material of the first barrier layer till to the substrate, that is, the substrate is exposed to the bottom of the first recessed structure. In the process of forming the first recessed structure by etching, the upper surface of the first conductive layer is etched downward to remove only part of the material of the first conductive layer. The bottom of the first recessed structure is still the material of the first conductive layer.

As shown in FIG. 7, the cross-sectional area of the conductive column is larger than the cross-sectional area of the contact pad. The lower part of the conductive column wraps the corresponding contact pad and the first barrier layer attached to the contact pad. The upper part of the conductive column is a hollow structure. A part of the material of the first conductive layer is provided between the first barrier layer and the hollow structure.

Here, the conductive column and the barrier layer connected to the conductive column form the lower electrode of the semiconductor structure. The lower surface of the lower electrode of the semiconductor structure is combined with the contact pad.

Figure 8:
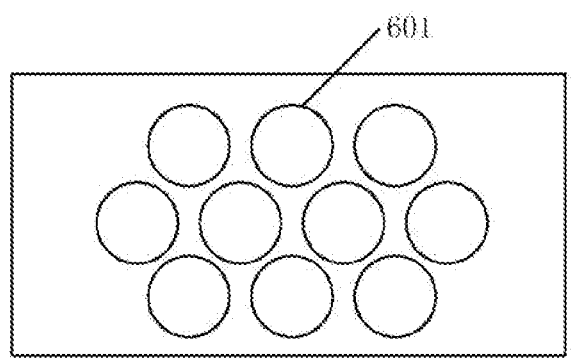
FIG. 8 is a top view after forming a first recessed structure in step S204.

As shown in FIGS. 6 and 8, the projection of the first recessed structure on the substrate does not overlap the projection of the contact pad on the substrate. The projection of the first recessed structure on the substrate surrounds the projection of the contact pad on the substrate. As shown in FIG. 8, the top of the conductive column is arranged in a hexagonal array, corresponding to the arrangement of the contact pads 302.

Figure 9:
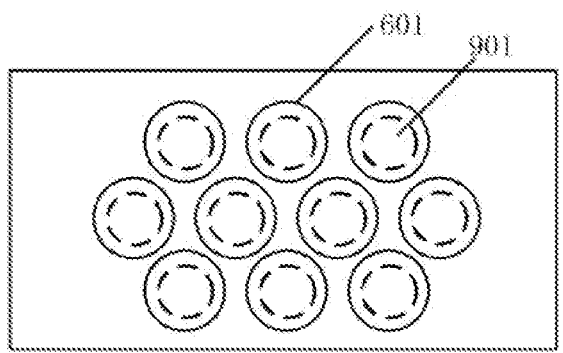
FIG. 9 is a top view after forming a second recessed structure in step S204.

As shown in FIG. 9, the second recessed structure may be a cylindrical recessed structure corresponding to an opening 901.

Figure 10:
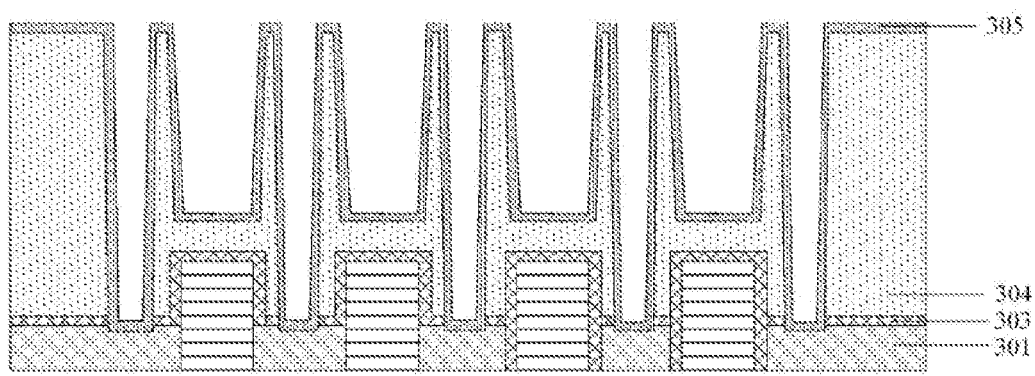
FIG. 10 is a schematic cross-sectional view after forming a first dielectric layer in step S205.

In step S205: as shown in FIG. 10, a high-K dielectric layer may be formed on the first conductive layer 304 as the first dielectric layer 305. The material of the high-K dielectric layer includes one or more of hafnium oxide, zirconium oxide, aluminum oxide or a mixture thereof.

Figure 11:
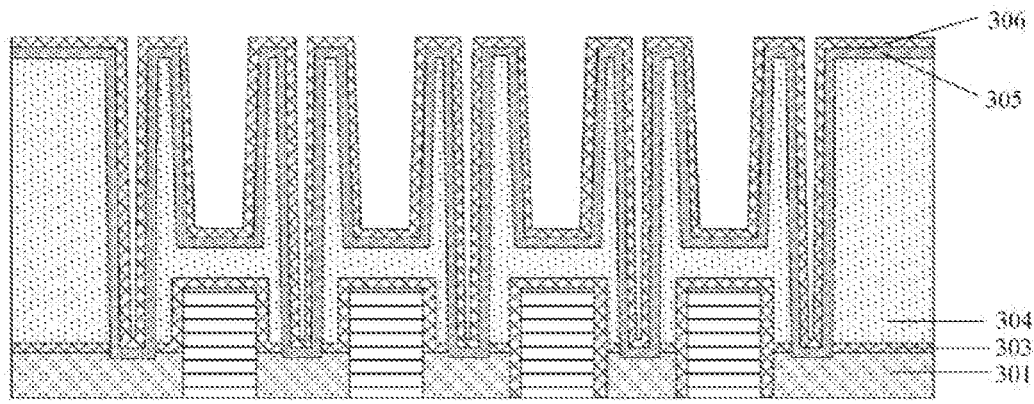
FIG. 11 is a schematic cross-sectional view after forming a second barrier layer in step S205.

As shown in FIG. 11, a titanium nitride material may be deposited on the surface of the first dielectric layer 305 to form the second barrier layer 306.

A polysilicon layer is formed as the second conductive layer 307 on the second barrier layer 306. The upper electrode of the semiconductor structure includes a second conductive layer 307.

The first conductive layer 304 and the second conductive layer 307 may be of the same or different materials selected from a group consisting of tungsten (W), titanium (Ti), titanium nitride (TiN), tantalum (Ta), tantalum nitride (TaN), and aluminum (Al), and may be a single-layer structure or a composite-layer structure.

The high-K medium may be a dielectric layer or a dielectric stack formed by one or more of a group consisting of zirconium oxide (ZrOx), hafnium oxide (HfOx), titanium zirconium oxide (ZrTiOx), ruthenium oxide (RuOx), antimony oxide (SbOx), and aluminum oxide (AlOx).

In the method for manufacturing the semiconductor structure provided by some embodiments of the present disclosure, the first conductive layer is etched to form the recessed structure so that the lower electrode corresponding to the contact pad is formed on the first conductive layer, which is beneficial to maintaining the stability of the semiconductor during the manufacturing process.

Figure 12:
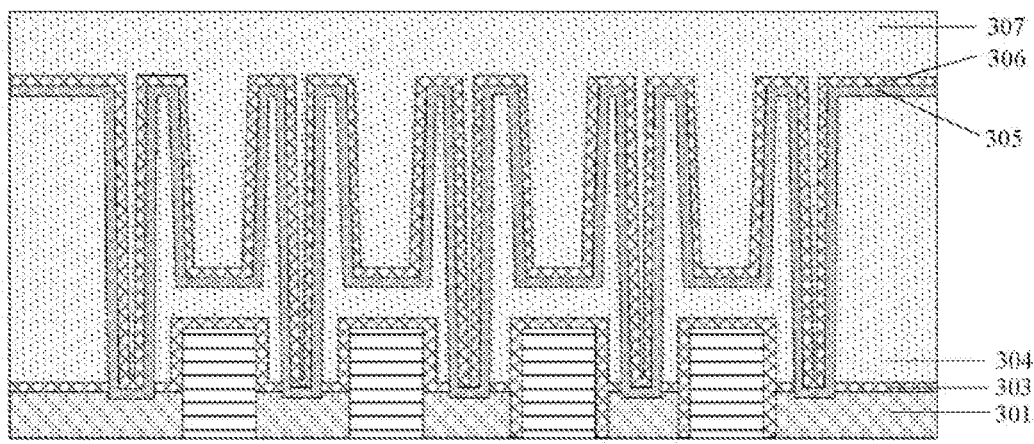
FIG. 12 is a schematic cross-sectional view after forming a second conductive layer in step S205.

As shown in FIG. 12, the semiconductor structure provided by the embodiment of the present disclosure includes: the substrate 301 in which the plurality of contact pads 302 arranged in an array are provided, wherein the thickness of the contact pad 302 is greater than that of the upper surface protruding from the substrate; the first barrier layer 303, arranged on the substrate 301 and the upper surface of the contact pad 302; the first conductive layer 304, arranged on the surface above the first barrier layer; the first recessed structure and the second recessed structure, wherein the first recessed structure extends from the upper surface of the first conductive layer 304 downwards to the substrate 301, the projection of the first recessed structure on the substrate 301 surrounds the contact pad 302, the second recessed structure is formed in the first conductive layer 304 and arranged in the contact pad 302, in other embodiments, the bottom of the second recessed structure also exposes the first barrier layer; and the first dielectric layer 305, the second barrier layer 306, and the second conductive layer 307 sequentially arranged above the first conductive layer 304.

In the technical solution of the embodiment of the present disclosure, the first conductive layer is etched to form the recessed structure and a lower electrode of a semiconductor structure. Compared with the related arts that the dielectric layer is etched to form holes, the holes are used as the matrix to deposit the thin film to produce the lower electrode, which improves the stability of the semiconductor structure.

The first dielectric layer 305 may be a high-K dielectric layer. The first conductive layer 304 and the second conductive layer 307 may be polysilicon layers, and the first barrier layer 303 and the second barrier layer 306 may be titanium nitride layers.

The first conductive layer of the semiconductor structure includes a plurality of hollow cylindrical conductive columns 601 surrounded by the first recessed structure and the second recessed structure. The hollow cylindrical conductive columns 601 correspond to the contact pad 302 in terms of positions and numbers one by one. The upper part of the hollow cylindrical conductive column 601 has a cylindrical structure opening with an upper opening. The bottom of the hollow cylindrical conductive column covers the part of the contact pad protruding from the upper surface of the substrate.

When the first conductive layer is a polysilicon layer, the conductive column 601 is a polysilicon column.

In the semiconductor structure provided by some embodiments of the present disclosure, the first conductive layer is etched to form the recessed structure so that the lower electrode corresponding to the contact pad is formed on the first conductive layer, which is beneficial to maintaining the stability of the semiconductor during the manufacturing process.

Those ordinary persons skilled in the art easily think of other embodiments of the present disclosure after considering the specification and practicing the disclosure disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are to be regarded as exemplary only, and the true scope and spirit of the present disclosure are defined by the following claims.

It should be understood that the present disclosure is not limited to the precise structure that is described above and shown in the drawings, and various modifications and changes can be made without departing from the scope the present disclosure. The scope of the present disclosure is only limited by the appended claims.

The invention claimed is:
1. A method for manufacturing a semiconductor structure, comprising the following steps:
   providing a substrate, wherein a plurality of contact pads arranged in an array are provided in the substrate, and the plurality of contact pads protrude from an upper surface of the substrate;

forming a first barrier layer on the substrate and surfaces of the plurality of contact pads, wherein the first barrier layer is in direct contact with the substrate and surfaces of the plurality of contact pads;

forming a first conductive layer on a surface of the first barrier layer;

etching an upper surface of the first conductive layer to form a first recessed structure and a second recessed structure, wherein the first recessed structure extends downwards to the substrate, a projection of the first recessed structure on the substrate surrounds a given one of the plurality of contact pads, and the second recessed structure is formed in the first conductive layer and arranged above the corresponding contact pad; and forming a first dielectric layer, a second barrier layer, and a second conductive layer sequentially on surfaces of the first conductive layer;

wherein the first conductive layer comprises a plurality of hollow cylindrical conductive columns surrounded by the first recessed structure and the second recessed structure, and the plurality of hollow cylindrical conductive columns correspond to the plurality of contact pads in terms of positions and numbers one by one, and an opening is provided above each of the plurality of hollow cylindrical conductive columns.

2. The method according to claim 1, wherein forming the first barrier layer on the substrate and the surfaces of the plurality of contact pads comprises:

depositing a titanium nitride material on the surface of the substrate and a surface of a part of the contact pad protruding from a top surface of the substrate to form the first barrier layer.

3. The method according to claim 1, wherein forming the first conductive layer on the surface of the first barrier layer comprises:

depositing a polysilicon material on a surface of the first barrier layer to form the first conductive layer.

4. The method according to claim 1, wherein forming the first dielectric layer, the second barrier layer, and the second conductive layer sequentially on the surfaces of the first conductive layer comprises:

forming a high-K dielectric layer on the surface of the first conductive layer as the first dielectric layer, wherein material of the high-K dielectric layer comprises hafnium oxide, zirconium oxide, aluminum oxide or a mixture of two or more thereof.

5. The method according to claim 1, wherein forming the first dielectric layer, the second barrier layer, and the second conductive layer sequentially on the surfaces of the first conductive layer comprises:

depositing a titanium nitride material on a surface of the first dielectric layer to form the second barrier layer.

6. The method according to claim 1, wherein etching the upper surface of the first conductive layer to form the first recessed structure and the second recessed structure comprises:

etching the first conductive layer and the first barrier layer till to the upper surface of the substrate to form conductive columns arranged above the plurality of contact pads, the conductive columns have same number as the plurality of contact pads; and etching an upper surface of each conductive column to form a hollow cylindrical structure with an upper opening.

7. The method according to claim 6, wherein cross-sectional area of each conductive column is larger than that of each contact pad.

8. The method according to claim 7, wherein an upper part of the conductive column is a hollow structure, and a part of material of the first conductive layer is provided between the first barrier layer and the hollow structure.

9. A semiconductor structure, comprising:

a substrate, wherein a plurality of contact pads arranged in an array are provided in the substrate, and the plurality of contact pads protrude from an upper surface of the substrate;

a first barrier layer, arranged on the substrate and surfaces of the plurality of contact pads, wherein the first barrier layer is in direct contact with the substrate and surfaces of the plurality of contact pads;

a first conductive layer, arranged on a surface of the first barrier layer;

a first recessed structure and a second recessed structure, wherein the first recessed structure extends downwards from an upper surface of the first conductive layer to the substrate, a projection of the first recessed structure on the substrate surrounds a given one of the plurality of contact pads, and the second recessed structure is formed in the first conductive layer and arranged above the contact pad; and a first dielectric layer, a second barrier layer, and a second conductive layer sequentially arranged above the first conductive layer;

wherein the first conductive layer comprises a plurality of hollow cylindrical conductive columns surrounded by the first recessed structure and the second recessed structure, and the plurality of hollow cylindrical conductive columns correspond to the plurality of contact pads in terms of positions and numbers one by one, and an opening is provided above each of the plurality of hollow cylindrical conductive columns.

10. The semiconductor structure according to claim 9, wherein the first dielectric layer comprises a high-K dielectric layer, material of the high-K dielectric layer comprises hafnium oxide, zirconium oxide, aluminum oxide or a mixture of two or more thereof; and/or, the first conductive layer and the second conductive layer comprise a polysilicon layer; and/or, the first barrier layer and the second barrier layer comprise a titanium nitride layer.

11. The semiconductor structure according to claim 9, wherein bottom of each of the plurality of hollow cylindrical conductive columns covers a part of each of the plurality of contact pads protruding from the upper surface of the substrate.

12. The semiconductor structure according to claim 9, wherein the substrate is made of silicon nitride, and the plurality of contact pads are made of polysilicon.

13. The semiconductor structure according to claim 9, wherein materials of the first conductive layer and the second conductive layer are selected from a group consisting of tungsten, titanium, titanium nitride, tantalum, tantalum nitride, and aluminum.

14. The semiconductor structure according to claim 13, wherein each of the first conductive layer and the second conductive layer is a single-layer structure or a composite-layer structure.

* * * * *